(12) United States Patent
Iwadate et al.

(10) Patent No.: US 8,084,314 B2
(45) Date of Patent: Dec. 27, 2011

(54) SEMICONDUCTOR DEVICE AND MANUFACTURING METHOD THEREOF

(75) Inventors: Hidenori Iwadate, Hyogo (JP); Takeshi Kobiki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/854,717

(22) Filed: Aug. 11, 2010

(65) Prior Publication Data

US 2010/0304545 A1    Dec. 2, 2010

Related U.S. Application Data

(62) Division of application No. 12/046,001, filed on Mar. 11, 2008, now Pat. No. 7,795,701.

(30) Foreign Application Priority Data

Mar. 12, 2007   (JP) ................................. 2007-061711

(51) Int. Cl.
   *H01L 21/8238*   (2006.01)
(52) U.S. Cl. ........ 438/210; 438/238; 438/348; 257/379; 257/380; 257/E27.035
(58) Field of Classification Search ............... None
   See application file for complete search history.

(56) References Cited

U.S. PATENT DOCUMENTS

| | | | |
|---|---|---|---|
| 5,751,050 A * | 5/1998 | Ishikawa et al. | 257/538 |
| 6,069,063 A * | 5/2000 | Chang et al. | 438/528 |
| 6,087,206 A | 7/2000 | Hamada | |
| 6,100,154 A * | 8/2000 | Hsu et al. | 438/385 |
| 6,180,479 B1 * | 1/2001 | Yoshikawa | 438/384 |
| 6,232,194 B1 * | 5/2001 | Yaung et al. | 438/382 |
| 6,340,833 B1 * | 1/2002 | Liu et al. | 257/536 |
| 6,568,269 B2 | 5/2003 | Nakabayashi | |
| 7,566,607 B2 * | 7/2009 | Dainin | 438/210 |

FOREIGN PATENT DOCUMENTS

| | | |
|---|---|---|
| JP | 3-89549 | 3/1991 |
| JP | 06-085175 | 3/1994 |
| JP | 2001-35849 | 2/2001 |
| JP | 02002009249 A * | 1/2002 |
| JP | 2004-296767 | 10/2004 |

* cited by examiner

*Primary Examiner* — Zandra Smith
*Assistant Examiner* — Khanh Duong
(74) *Attorney, Agent, or Firm* — McDermott Will & Emery LLP

(57) ABSTRACT

A first insulation film is provided on a semiconductor substrate. A high resistance element formed from polysilicon is provided on the first insulation film. A second insulation film is provided on the high resistance element. A hydrogen diffusion preventing film having a hydrogen diffusion coefficient smaller than that of the second insulation film is provided on the second insulation film. The hydrogen diffusion preventing film covers a part of the high resistance element.

15 Claims, 8 Drawing Sheets

F I G. 7
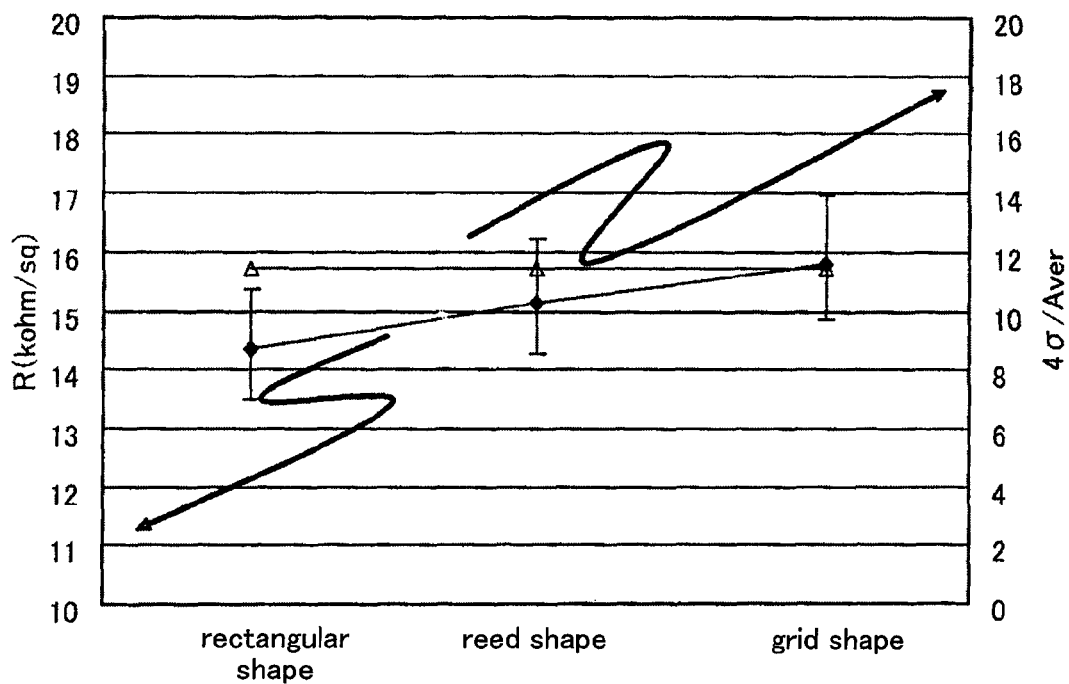
F I G. 8
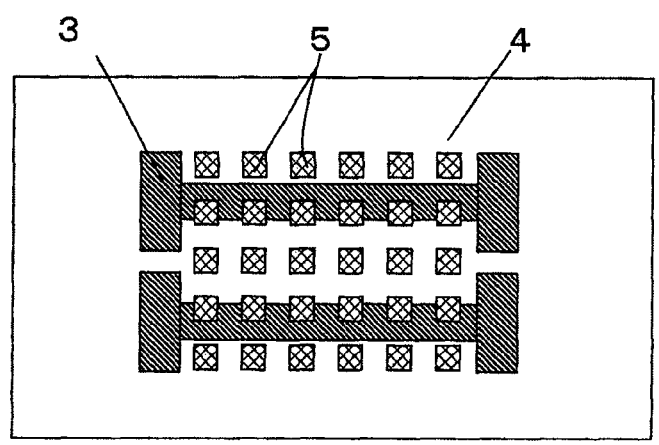

F I G. 9
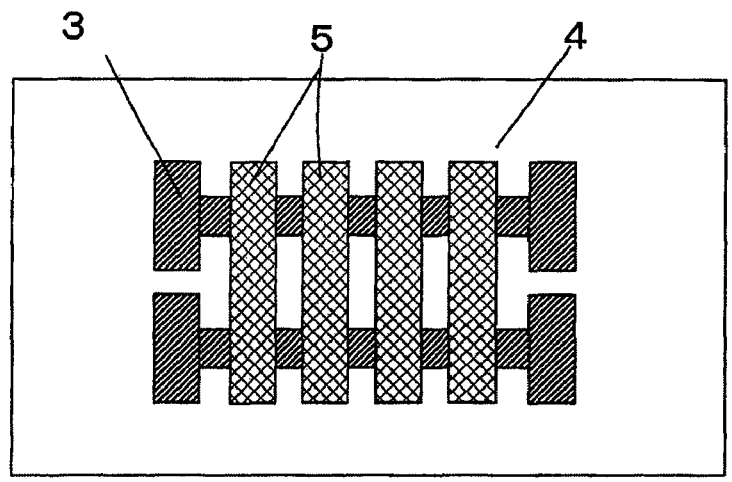
F I G. 10
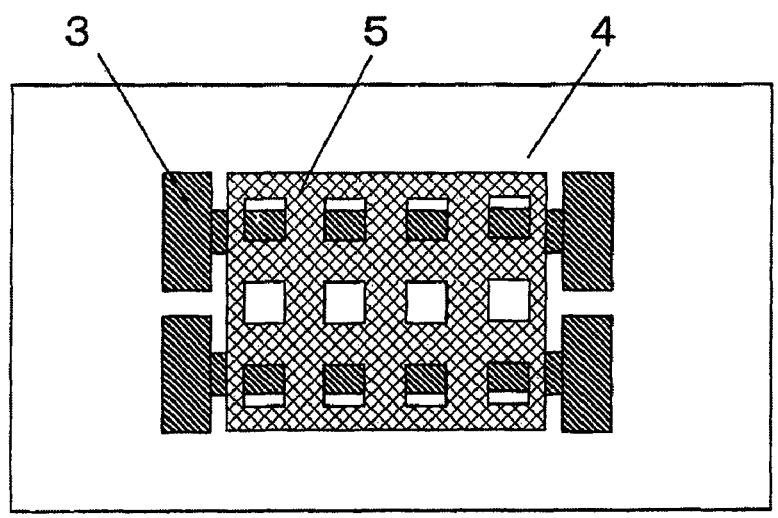

F I G. 1 1
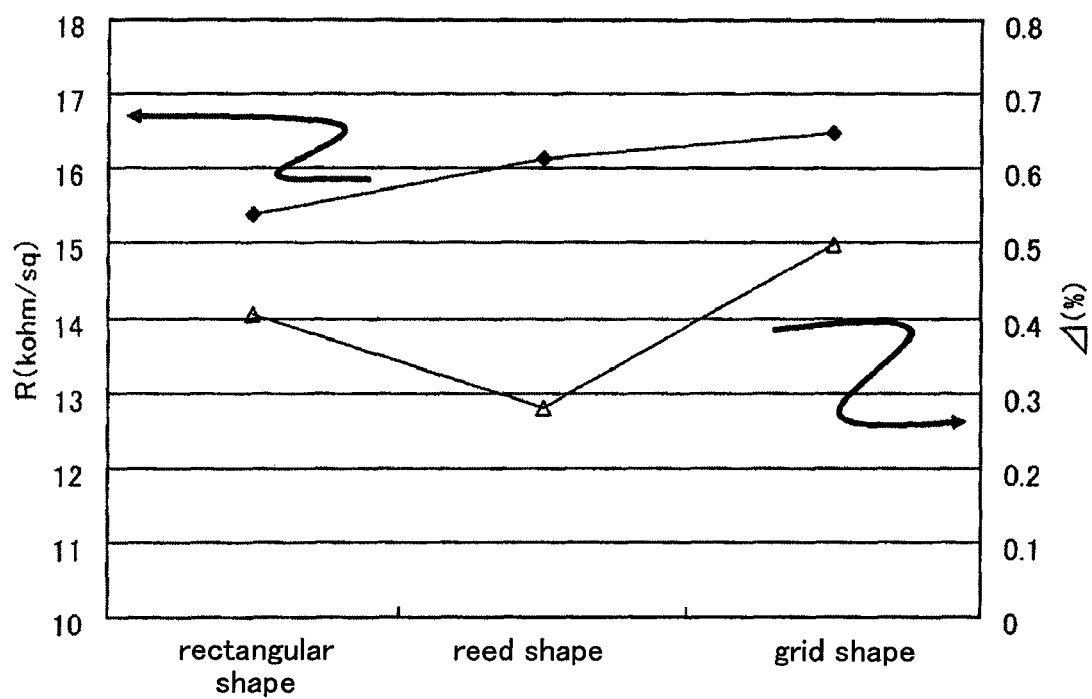

F I G. 1 3
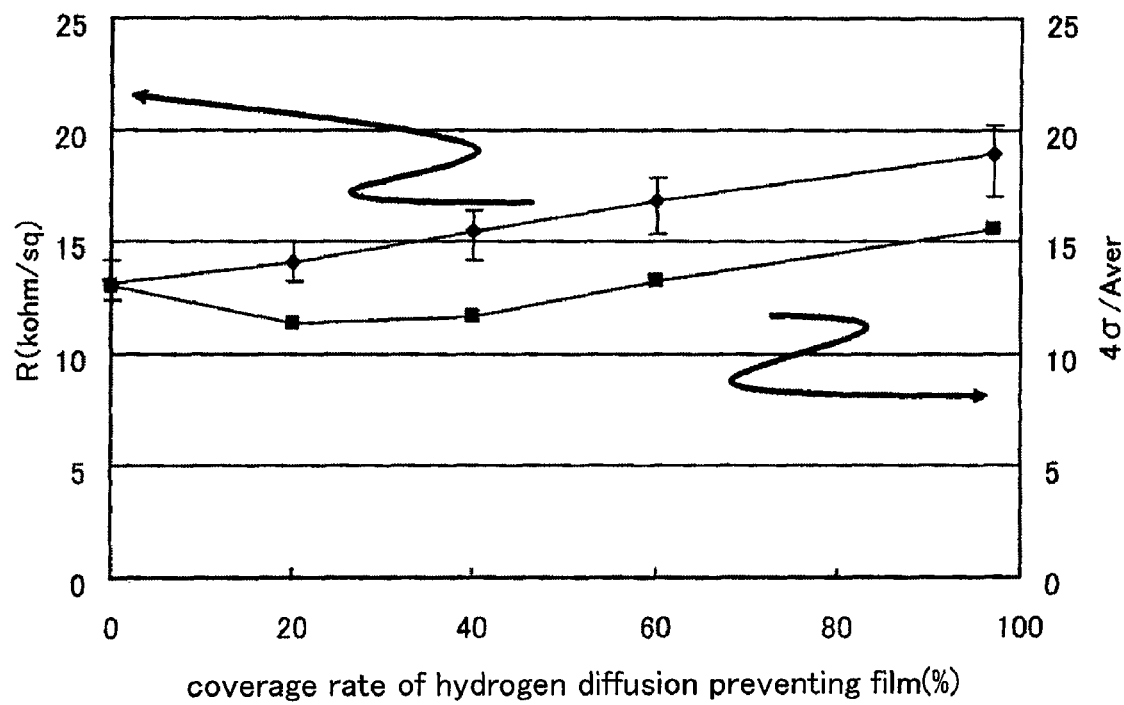

SEMICONDUCTOR DEVICE AND MANUFACTURING METHOD THEREOF

RELATED APPLICATIONS

This application is a Divisional of U.S. application Ser. No. 12/046,001, filed on Mar. 11, 2008, now U.S. Pat. No. 7,795,701 claiming priority of Japanese Patent Application No. 2007-061711, filed on Mar. 12, 2007, the entire contents of each of which are hereby incorporation by reference.

BACKGROUND OF THE INVENTION

1. Field of the Invention

The present invention relates to a semiconductor device comprising a high resistance element formed from polysilicon and particularly superior in terms of a relative accuracy in comparison to any other high resistance element formed from polysilicon and a method of manufacturing the semiconductor device.

2. Description of the Related Art

Today, an analog circuit, a typical example of which is a system power supply circuit, is characterized in its large-scale circuit configuration comprising a plurality of mixed analog circuits such as a variable amplifier, a regulator and a charging voltage control circuit. In these exemplified circuits, wherein resistance elements constitute the circuits, a chip size tends to be larger along with the increasingly larger circuit scale because a large number of resistance elements are provided and resistance values thereof are high. In the recent trend, however, the chip size is reduced in order to comply with the reduction of devices in size (a typical example is a mobile telephone). Further, there are different reference potentials in different circuit blocks in these analog circuits. Therefore, it is necessary for the resistance elements constituting these circuits to be independent from a semiconductor substrate potential in order to obtain stable circuit characteristics. As a result, high resistance elements formed from polysilicon, in place of diffused resistors, are now often provided in these analog circuits.

However, in the high resistance element formed from polysilicon (for example, silicon nitride film formed thereon, which is used as a passivation film, deposited by means of the plasma CVD method), hydrogen is generated from silane gas used as a material when the nitride film is deposited, and hydrogen is thereby included in the nitride film itself in a large percentage. Therefore, when hydrogen present in the film diffuses in polysilicon (resistor), the problem that the resistance values unfavorably become variable arises.

In order to solve the foregoing problem, the high resistance element formed from polysilicon, and capable of preventing the diffusion of hydrogen in polysilicon during a manufacturing process and maintaining a high resistance value in a stable manner was proposed (for example, see U.S. Pat. No. 3,195,828 of the Japanese Patent Gazette).

In polysilicon including a number of grain boundaries, dangling bonds are easily generated, which leads to the generation of a large number of electrically active defects in polysilicon. It is known that these dangling bonds are stabilized by hydrogen. Hydrogen has a very high reactivity and can be speedily diffused in a solid. In the presence of the film which includes a large amount of hydrogen, such as the plasma silicon film, on the high resistance element, therefore, hydrogen included in the film diffuses in polysilicon, and the dangling bonds are thereby terminated. As a result, the conductance of the polysilicon is reduced.

In the high resistance element formed from polysilicon, wherein an introduced impurity concentration is low, there are a large number of dangling bonds in polysilicon. Of the resistances formed from polysilicon, a low resistance element, which is formed from polysilicon and characterized in its high introduced impurity concentration, includes less dangling bonds in comparison to the high resistance element. The variability of the resistance value resulting from polysilicon depends on the variation of the dangling bonds included in polysilicon. Therefore, the variability of the resistance value, which is generated by hydrogen of the resistance element formed from polysilicon, hardly thereby affects the low resistance element, while the reliability of the resistance value largely thereby affects the high resistance element.

SUMMARY OF THE INVENTION

The dependency of an amount of hydrogen diffused in polysilicon, which was found by the inventors of the present invention, is described referring to FIG. 13. FIG. 13 shows a measurement result in a state where a coverage rate of a hydrogen diffusion preventing film covering polysilicon is changed in order to control the amount of hydrogen diffusing in polysilicon. The measurement result was studied, and it was confirmed that the resistance value varied in proportion to the coverage rate of the hydrogen diffusion preventing film, in other words, the amount of hydrogen diffusing in polysilicon. In the case where there is no factor which inhibits the diffusion of hydrogen in polysilicon, the resistance value is reduced by approximately 30% in comparison to the case where hydrogen does not diffuse in polysilicon. As is clear from the result, the variability of the resistance value can be controlled when the diffusion of hydrogen in polysilicon is prevented, by which the high resistance value is retained at a high level. However, the accuracy of the resistance value is worst in the state where hydrogen does not diffuse in polysilicon.

When the diffusion of hydrogen in polysilicon is controlled, the dangling bonds present in polysilicon are not hydrogen-terminated, and although the change of the conductance can be thereby controlled, the dangling bonds are present and remain as active charge trap. The number of the dangling bonds present in polysilicon is different from one resistance element to another. Therefore, the difference in the number of the dangling bonds electrically active affects an absolute accuracy and a relative accuracy of the resistances.

In the analog circuits such as the variable amplifier, regulator and charging voltage control circuit, wherein the circuits are operated by a voltage difference and a voltage ratio between the high resistance elements, the variability in the accuracy of the resistances is the direct cause of the deterioration of the circuit characteristics even though the variation of the resistance values is controlled and the high resistance values are obtained. Therefore, in these analog circuits, the relative accuracy between the resistance elements is very important. In the case of the regulator circuit, for example, the high resistance elements are used as feedback resistances for deciding an output voltage, and therefore, the relative accuracy between the used resistance elements must be high. Further, in order to reduce the chip size in the circuit comprising a large number of high resistance elements, it is necessary to reduce the size of the high resistance element. In order to realize that, it is necessary to reduce the width of the resistance. Because the accuracy of the resistance value is generally lessened as the width of the resistance is smaller, it is necessary to improve the accuracy of the resistance value in order to reduce the size. In the conventional high resistance element formed from polysilicon, the variability of the resistance value is controlled by preventing the diffusion of hydrogen in polysilicon, and the high resistance value is thereby obtained. However, the resistance value is less accurate. Therefore, in order to prevent the deterioration of the circuit characteristics, an additional circuit such as a trimming element for compensating for the resistance variability is necessary in the analog circuit. As a result, the chip size is increased contrary to expectations.

Therefore, a main object of the present invention is to provide a semiconductor device comprising a high resistance element formed from polysilicon which is superior in terms of a relative accuracy and an absolute accuracy and a method of manufacturing the semiconductor device.

In order to achieve the foregoing object, a semiconductor device according to the present invention comprises a first insulation film provided on a semiconductor substrate;

a high resistance element formed from polysilicon and provided on the first insulation film;

a second insulation film provided on the high resistance element; and a hydrogen diffusion preventing film formed from a material having a hydrogen diffusion coefficient smaller than that of the second insulation film and provided on the second insulation film, wherein the hydrogen diffusion preventing film covers a part of the high resistance element.

The semiconductor device preferably comprises a plurality of high resistance elements having an identical shape as the high resistance element, wherein the hydrogen diffusion preventing film covers a part, being equal in area, of each of the plurality of high resistance elements.

In the semiconductor device, the hydrogen diffusion preventing film is preferably a conductive film including titanium nitride.

In the semiconductor device, the hydrogen diffusion preventing film is preferably an insulation film including silicon nitride.

The semiconductor device preferably comprises a plurality of hydrogen diffusion preventing films, wherein the hydrogen diffusion preventing films are provided in parallel on the second insulation film with an equal interval therebetween.

In the semiconductor device, the hydrogen diffusion preventing film is preferably provided orthogonal to the high resistance element.

In the semiconductor device, a potential of the hydrogen diffusion preventing film is in a floating state.

The semiconductor device preferably has a multilayer wiring structure, wherein at least wiring of a bottom layer in the multilayer wiring structure constitutes the hydrogen diffusion preventing film.

A method of manufacturing a semiconductor device according to the present invention includes a step of forming a first insulation film on a semiconductor substrate;

a step of forming a high resistance element made of polysilicon on the first insulation film;

a step of forming a second insulation film on the high resistance element; and a step of forming a hydrogen diffusion preventing film from a material having a hydrogen diffusion coefficient smaller than that of the second insulation film on the second insulation film, wherein the hydrogen diffusion preventing film is formed so as to cover a part of the high resistance element.

In the method of manufacturing the semiconductor device, the semiconductor device preferably has a multilayer wiring structure, a conductive film including titanium nitride is preferably formed as the hydrogen diffusion preventing film, and the hydrogen diffusion preventing film is preferably formed at the same time as the formation of at least wiring of a bottom layer in the multilayer wiring structure.

In the semiconductor device and the method of manufacturing the semiconductor device according to the present invention, In the high resistance element formed from polysilicon, the amount of hydrogen diffusing in polysilicon can be controlled by the area of polysilicon covered by the hydrogen diffusion preventing film; and Because the hydrogen diffusion preventing film covers only a part of polysilicon, hydrogen does not overly diffuse in polysilicon, and an appropriate amount of hydrogen can be caused to diffuse so that only the dangling bonds are hydrogen-terminated.

As described, the conductance of polysilicon can be stabilized, and the high resistance element superior in the absolute accuracy and relative accuracy between the resistance values can be realized.

The present invention is effectively applied to a semiconductor device comprising a high resistance element formed from polysilicon.

BRIEF DESCRIPTION OF THE DRAWINGS

These and other objects as well as advantages of the invention will become clear by the following description of preferred embodiments of the invention, and be described in the claims attached hereto. A number of benefits not recited in this specification will come to the attention of the skilled in the art upon the implementation of the present invention.

FIG. 7 is a graph showing a dependency of an absolute accuracy of a high resistance element on shapes of a hydrogen diffusion preventing film in the case where a coverage rate of the hydrogen diffusion preventing film is constant.

FIG. 8 is a plan view of a high resistance element in which its hydrogen diffusion preventing film has a rectangular shape.

FIG. 9 is a plan view of a high resistance element in which its hydrogen diffusion preventing film has a reed shape.

FIG. 10 is a plan view of a high resistance element in which its hydrogen diffusion preventing film has a grid shape.

FIG. 11 is a graph showing a dependency of a relative accuracy of the high resistance element on the shapes of the hydrogen diffusion preventing film in the case where the coverage rate of the hydrogen diffusion preventing film is constant.

FIG. 13 is a graph showing a dependency of the variability of a resistance value of the high resistance element on the coverage rate of the hydrogen diffusion preventing film.

DETAILED DESCRIPTION OF THE INVENTION

Figure 1:
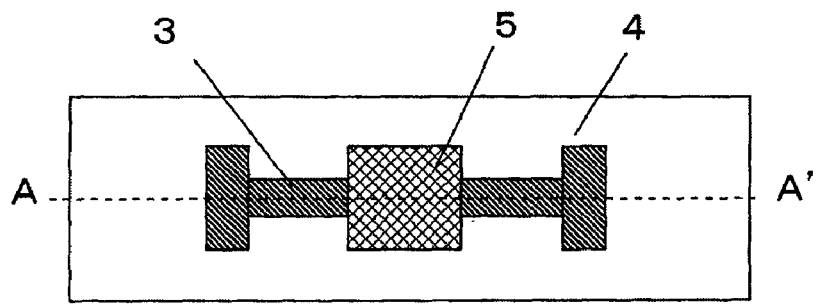
FIG. 1 is a plan view of a semiconductor device according to a preferred embodiment 1 of the present invention.

Hereinafter, preferred embodiments of the present invention are described referring to the drawings.

Preferred Embodiment 1

Figure 2:
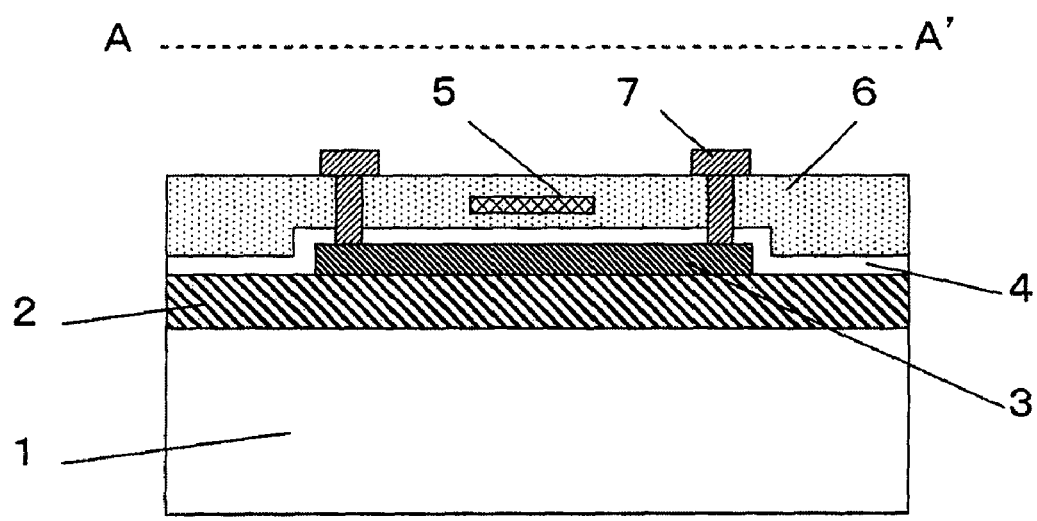
FIG. 2 is a sectional view of A-A' section of the semiconductor device shown in FIG. 1.

FIG. 1 is a plan view of a semiconductor device according to a preferred embodiment 1 of the present invention. FIG. 2 is a sectional view of A-A' section of the semiconductor device shown in FIG. 1. In FIG. 1, a first insulation film 2 is formed on a semiconductor substrate 1, and a high resistance element 3 is formed from polysilicon on the first insulation film 2. The high resistance element 3 is covered with a second insulation film 4. The high resistance element 3 according to the present invention is a resistance element having a resistance value of at least a few kΩ/sq. A hydrogen diffusion preventing film 5 is provided on the second insulation film 4. The hydrogen diffusion preventing film 5 has a hydrogen diffusion coefficient smaller than that of the second insulation film 4. The hydrogen diffusion preventing film 5 has a shape smaller than that of the second insulation film 4 and is provided so as to cover a part of the high resistance element 3. A reference numeral 6 denotes a passivation film, and a reference numeral 7 denotes a contact section.

The semiconductor device thus constituted controls an amount of hydrogen diffusing in polysilicon constituting the high resistance element 3 by using the hydrogen diffusion preventing film 5. Further, the semiconductor device controls the amount of hydrogen by adjusting an area of the hydrogen diffusion preventing film 5 which covers the high resistance element 3. Therefore, an amount of hydrogen necessary for only the dangling bonds in polysilicon to be hydrogen-terminated can be accurately caused to diffuse in polysilicon. Accordingly, the conductance of polysilicon can be stabilized, and control can be provided so that hydrogen does not overly diffuse. As a result, the variability of the resistance value can be controlled. Thus described, the high resistance element superior in the accuracy of a resistance value can be obtained.

Preferred Embodiment 2

Figure 3:
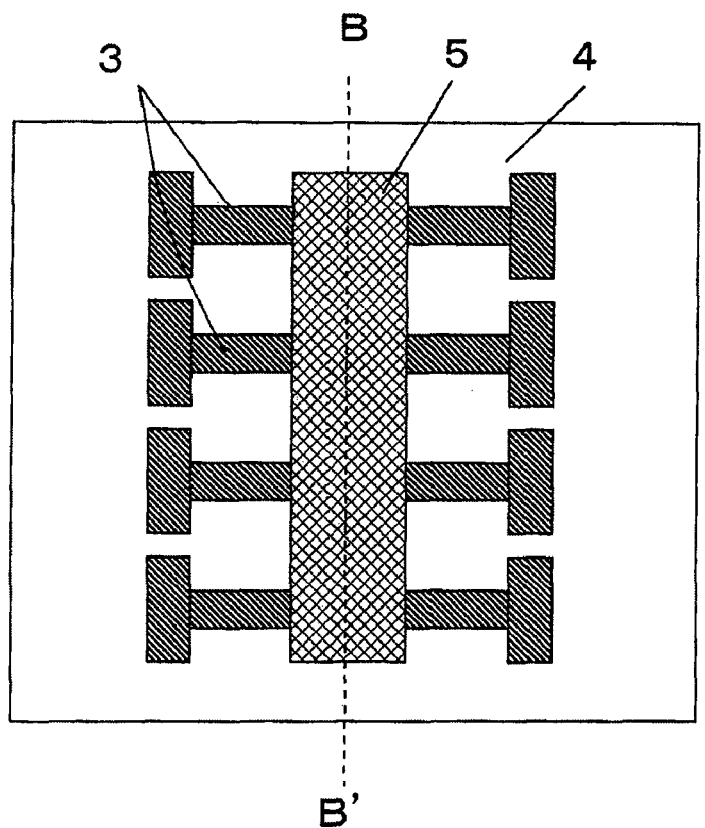
FIG. 3 is a plan view of a semiconductor device according to a preferred embodiment 2 of the present invention.
Figure 4:
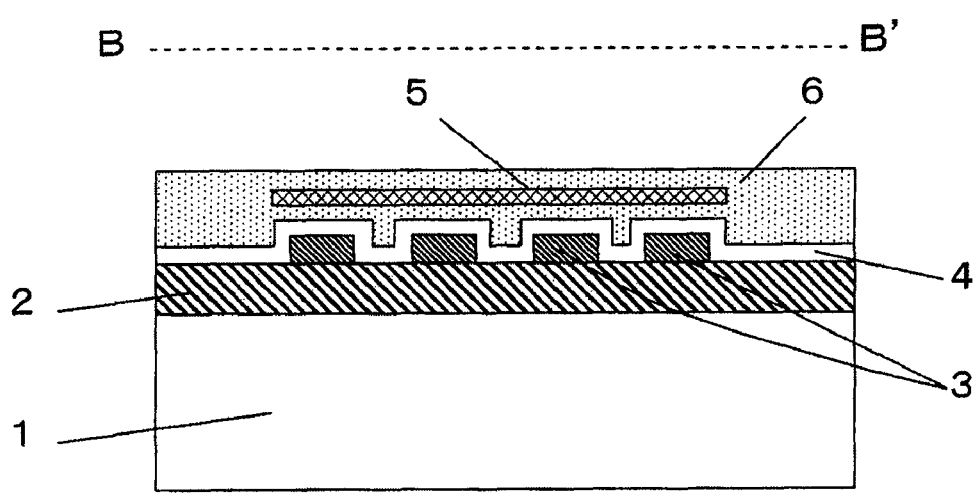
FIG. 4 is a sectional view of B-B' section of the semiconductor device shown in FIG. 3.

FIG. 3 is a plan view of a semiconductor device according to a preferred embodiment 2 of the present invention. FIG. 4 is a sectional view of B-B' section of the semiconductor device shown in FIG. 3. In these drawings, the first insulation film 2 is formed on the semiconductor substrate 1, and a plurality of high resistance elements 3 are formed on the first insulation film 2. The respective high resistance elements 3 are formed from polysilicon having an identical shape. The surfaces of the high resistance element 3 are covered with the second insulation film 4. The hydrogen diffusion preventing film 5 is provided on the second insulation film 4. The hydrogen diffusion preventing film 5 has a hydrogen diffusion coefficient smaller than that of the second insulation film 4. The hydrogen diffusion preventing film 5 is provided so as to equally cover a part of each of the high resistance elements 3. 6 denotes the passivation film.

As described, in the semiconductor device thus constituted, an equal area of a part of each of the plurality of high resistance elements 3 having the same shape is covered with the hydrogen diffusion preventing film 5. Therefore, an equal amount of hydrogen necessary for only the dangling bonds in polysilicon to be hydrogen-terminated can be accurately caused to diffuse in each polysilicon. Accordingly, polysilicon can be stabilized, and control can be provided so that hydrogen does not overly diffuse. As a result, the variability of the resistance value can be controlled. Thus described, the high resistance element superior in absolute accuracy (accuracy in the resistance value of each high resistance element 3) and relative accuracy (accuracy in the consistency of the resistance values between the high resistance elements 3) can be obtained.

Preferred Embodiment 3

Figure 5:
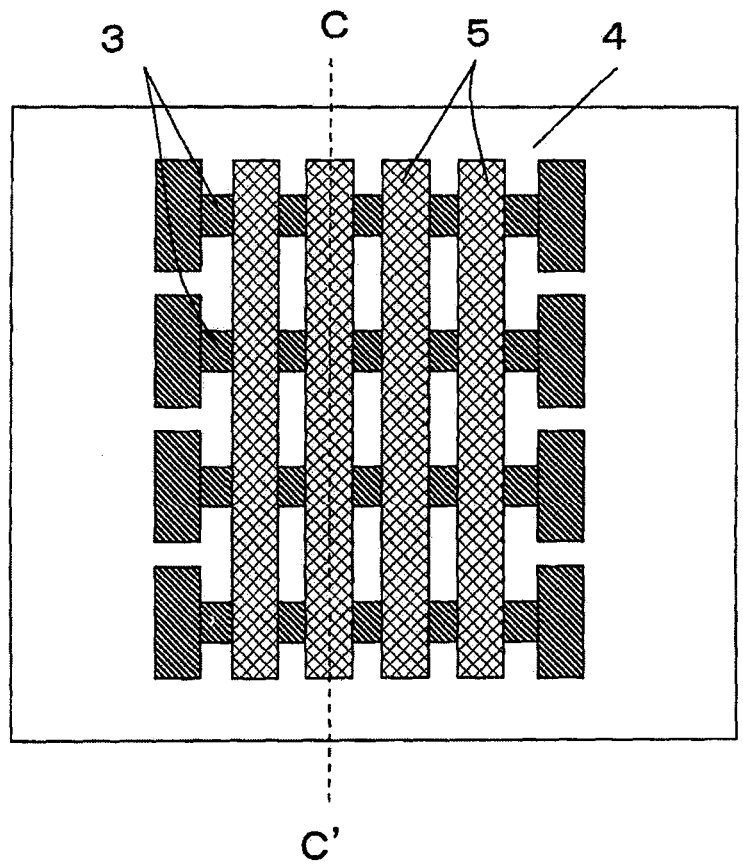
FIG. 5 is a plan view of a semiconductor device according to a preferred embodiment 3 of the present invention.
Figure 6:
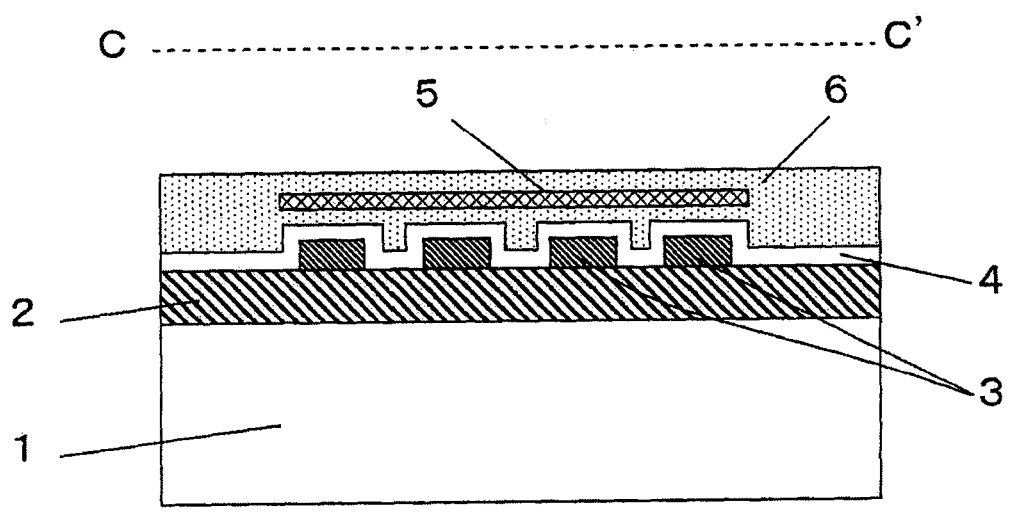
FIG. 6 is a sectional view of C-C' section of the semiconductor device shown in FIG. 5.

FIG. 5 is a plan view of a semiconductor device according to a preferred embodiment 3 of the present invention. FIG. 6 is a sectional view of C-C' section of the semiconductor device shown in FIG. 5. The present preferred embodiment is characterized in that a plurality of hydrogen diffusion preventing films 5 are formed in parallel in a reed shape in the constitution according to the preferred embodiment 2. The rest of the constitution, which are similar to those of the preferred embodiments 4 and 5, are simply provided with the same reference symbols and are not described again.

In the present preferred embodiment, wherein the reed-shape hydrogen diffusion preventing films 5 are formed in parallel on an equal area basis on the high resistance element 3, a section where hydrogen diffuses in polysilicon and a section where hydrogen does not diffuse in polysilicon, which are equal in area, exist in an upper section of the high resistance element 3. When a comparison is made between the constitution comprising only a single hydrogen diffusion preventing film (for example, the constitution according to the preferred embodiment 1) of which the total area covering polysilicon is equal to that of the hydrogen diffusion preventing films 5 according to the present preferred embodiment; and the constitution according to the present preferred embodiment comprising the hydrogen diffusion preventing films 5, the dangling bonds in polysilicon which are not hydrogen-terminated are more evenly distributed in the constitution wherein the hydrogen diffusion preventing films 5 are provided according to the present preferred embodiment.

In the constitution according to the preferred embodiment 1 wherein the single high resistance element 3 is provided, the plurality of hydrogen diffusion preventing films 5 may be provided in parallel with one another in a reed shape at equal intervals in the longitudinal direction of the high resistance element 3 as shown in FIG. 5. As a result, an effect similar to that of the present preferred embodiment can be obtained.

Below are described modified embodiments of the respective preferred embodiments. In the preferred embodiments, a conductive film including titanium nitride may be used as the hydrogen diffusion preventing film 5. Since the conductive film including titanium nitride is used as a wiring film of the semiconductor element, the hydrogen diffusion preventing film 5 can be formed at the same time as the formation of the wiring.

In the preferred embodiments, an insulation film including silicon nitride deposited by means of the LP-CVD method may be used as the hydrogen diffusion preventing film 5.

In the preferred embodiments, a potential of the hydrogen diffusion preventing film 5 may be in a floating state. Accordingly, in the case where a potential of the high resistance element 3 is changed, any influence from a parasitic capacitance between the high resistance element 3 and the hydrogen diffusion preventing film 5 can be avoided, which stabilizes the circuit characteristics. The floating potential is limitedly adopted in the case where the conductive film is used as the hydrogen diffusion preventing film 5, and is not adopted in the case where the insulation film is used as the hydrogen diffusion preventing film 5. In the present invention, the floating potential is applied to the conductive film including titanium nitride which is used as the hydrogen diffusion preventing film 5.

In the respective preferred embodiments, the semiconductor device has a multilayer wiring structure, wherein a wiring of a bottom layer in the multilayer wiring structure may be included when the hydrogen diffusion preventing film 5 is formed. In the semiconductor device having the multilayer wiring structure, the plasma processing is often provided when an inter-layer insulation film between the wiring is formed. Therefore, there is process in which a large amount of hydrogen is included in addition to those for the plasma silicon nitride film including a large amount of hydrogen, so that the possibility that hydrogen diffuses in polysilicon is increased. When the hydrogen diffusion preventing film 5 is formed from the wiring of the bottom layer as described, the amount of hydrogen diffusing in polysilicon can be controlled at a minimal level. Not only the wiring of the bottom layer but also wiring of an upper layer may constitute the hydrogen diffusion preventing film 5; however, there have to be the sections which are not covered with the hydrogen diffusion preventing film 5 when the high resistance element is viewed from the surface. The hydrogen diffusion preventing film 5 is formed by including the wiring of the bottom layer only when, in the case of the present embodiments, the hydrogen diffusion preventing film 5 is the conductive film including titanium nitride, and naturally, the wiring of the bottom layer can not be used in the case of the insulation film including silicon nitride. More specifically, aluminum-based wiring generally comprises (titanium nitride film+aluminum), in which case the titanium nitride film is effective as the hydrogen diffusion preventing film 5.

Even in the case where the coverage rate of the hydrogen diffusion preventing film 5 covering the high resistance element 3 is fixed value, the resistance value still changes depending on the shape of the hydrogen diffusion preventing film 5, and the accuracy is thereby deteriorated. FIG. 7 shows resistance values and the absolute accuracy in respect to resistance of the high resistance element 3 in which a part of polysilicon is covered with the hydrogen diffusion preventing films 5 each having different shapes but having the same coverage rate. FIG. 8 is a plan view of the high resistance element 3 in which the hydrogen diffusion preventing film 5 has a rectangular shape. FIG. 9 is a plan view of the high resistance element 3 in which the hydrogen diffusion preventing film 5 has a reed shape. FIG. 10 is a plan view of the high resistance element 3 in which the hydrogen diffusion preventing film 5 has a grid shape. The coverage rates of the hydrogen diffusion preventing films 5 shown in FIGS. 8, 9 and 10 covering polysilicon are equal to one another.

As shown in FIG. 7, provided that the hydrogen diffusion preventing films 5 have the same shape, the resistance value of the high resistance element 3 varies depending on the coverage rate of the hydrogen diffusion preventing film 5. However, the resistance value varies in the case where the shapes are different even though the coverage rate of the hydrogen diffusion preventing film 5 is constant. FIG. 11 shows the resistance values of the high resistant element 3 in the case where the shapes of the hydrogen diffusion preventing film 5 are different and the relative accuracy therebetween. It is learnt from the results shown in FIGS. 7 and 11 that in the case where the area of the hydrogen diffusion preventing film 5 is constant, the absolute accuracy of the resistances does not depend on the shape of the hydrogen diffusion preventing film 5 while the absolute value and the relative accuracy of the resistances depend on the shape of the hydrogen diffusion preventing film 5. The dependency results from the diffusion of hydrogen. Though the hydrogen diffusion preventing film 5 is present on polysilicon, hydrogen diffuses not only in the vertical direction but also in the horizontal direction. More specifically, the diffusion of most of hydrogen may be prevented by the hydrogen diffusion preventing film 5; however, a part of hydrogen diffuse in polysilicon from around the hydrogen diffusion preventing film 5. Comparing the different shapes of the hydrogen diffusion preventing film 5, which are the rectangular shape, reed shape and grid shape, to one another, the diffusion of hydrogen from around the hydrogen diffusion preventing film 5 is most likely to occur in the case of the rectangular shape, and is less likely in the case of the reed shape, and then, in the case of the grid shape. It is thereby learnt that the amount of hydrogen diffusing into polysilicon is larger in the reed shape than in the rectangular shape, and larger in the grid shape than in the reed shape. Therefore, the variability of the resistance value is increased in the same order.

On the other hand, the dangling bonds are distributed in polysilicon not evenly but locally. Therefore, the amount of the dangling bonds is increased as the polysilicon not part covered with the hydrogen diffusion preventing film 5, that is, the area in which hydrogen diffuses, is larger. In the case where the coverage rage of the hydrogen diffusion preventing film 5 is constant and the shape thereof is different, for example, when the rectangular shape and the reed shape are compared to each other, the resistance value is lowered in the case of the rectangular shape because the diffusion of hydrogen from around the hydrogen diffusion preventing film 5 is more likely to occur and the amount of the diffusing hydrogen is thereby increased. However, in the case of the reed shape in which the area of each hydrogen-diffusion section not covered with the hydrogen diffusion preventing film 5 is larger, the dangling bonds can be more effectively hydrogen-terminated. Therefore, the hydrogen diffusion preventing film 5 having the reed shape can obtain a superior relative accuracy between the resistance values. As a result, the high resistance element formed from polysilicon superior in relative accuracy can be obtained.

Figure 12A:
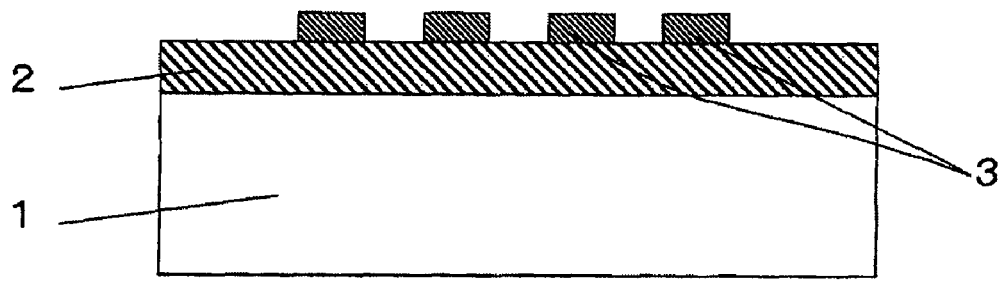
FIGS. 12A-12C are sectional views showing steps of a method of manufacturing the semiconductor device according to the preferred embodiment 2.
Figure 12B:
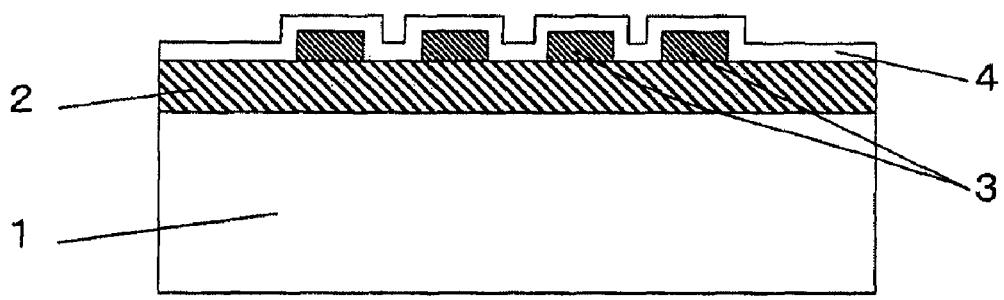
Figure 12C:
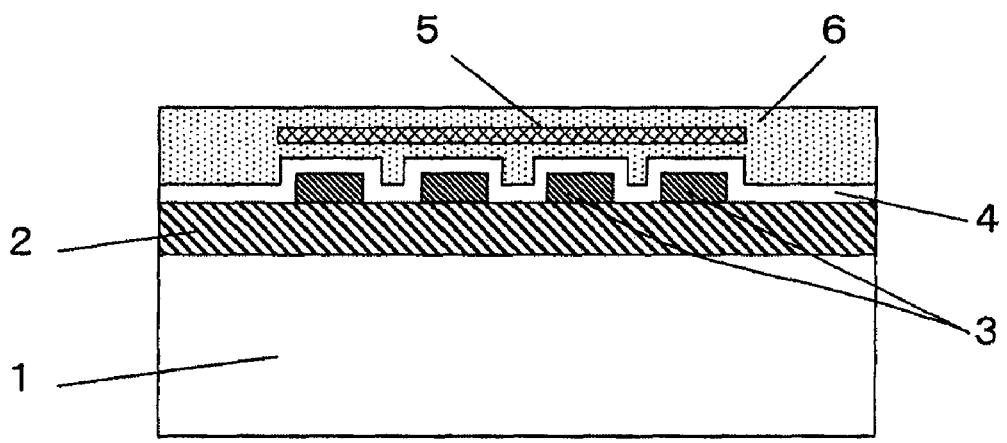

Referring to FIGS. 12A-12C, a method of manufacturing the semiconductor device is described. FIGS. 12A-12C are sectional views illustrating respective steps of manufacturing the semiconductor device comprising the high resistance element formed from polysilicon according to the preferred embodiment 2.

First, as shown in FIG. 12A, the first insulation film 2 is formed on the surface of the semiconductor substrate 1, and polysilicon is deposited thereon. Then, a patterning process is provided thereto by means of the photo resist, and the substrate is dry-etched to form a plurality of high resistance elements 3 having the same shape at predetermined positions.

Next, as shown in FIG. 12B, the second insulation film 4 is formed on the high resistance element 3. Then, as shown in FIG. 12C, the hydrogen diffusion preventing film 5 whose hydrogen diffusion coefficient is smaller than that of the second insulation film 4 is formed on the second insulation film 4. The patterning process is provided thereto by means of the photo resist, and the dry-etching process is also provided thereto. As a result, the hydrogen diffusion preventing film 5 is formed so as to cover a part of each of the high resistance elements 3 having the same shape. Then the passivation film 6 is formed.

In the semiconductor device thus manufactured, a part of each of the plurality of high resistance elements 3 having the same shape is equally covered with the hydrogen diffusion preventing film 5. Therefore, the same amount of hydrogen which is necessary for only the dangling bonds included in polysilicon to be hydrogen-terminated can be accurately caused to diffuse in each polysilicon. Accordingly, polysilicon can be stabilized, and hydrogen does not overly diffuse. As a result, the high resistance element, in which the variability of the resistance values is lessened and the relative accuracy between the resistance values is superior, can be obtained. The semiconductor device according to the preferred embodiments 1-3 can be manufactured according to steps similar to those shown in FIGS. 12A-12C.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A method of manufacturing a semiconductor device, the method including:
    a step of forming a first insulation film on a semiconductor substrate;
    a step of forming a high resistance element made of polysilicon on the first insulation film;
    a step of forming a second insulation film on the high resistance element; and
    a step of forming a hydrogen diffusion preventing film from a material having a hydrogen diffusion coefficient smaller than a hydrogen diffusion coefficient of the second insulation film on the second insulation film, wherein:
    the hydrogen diffusion preventing film is formed so as to cover a part of the high resistance element,
    the hydrogen diffusion preventing film comprises a plurality of hydrogen diffusion preventing films,
    the hydrogen diffusion preventing films are provided in parallel on the second insulation film with an equal interval therebetween, and
    the hydrogen diffusion preventing film is provided orthogonal to the high resistance element.

2. The method of manufacturing the semiconductor device as claimed in claim 1,
    wherein the semiconductor device has a multilayer wiring structure, a conductive film including titanium nitride is formed as the hydrogen diffusion preventing film, and the hydrogen diffusion preventing film is formed at the same time as the formation of at least wiring of a bottom layer in the multilayer wiring structure.

3. The method of manufacturing the semiconductor device as claimed in claim 1,
    wherein the high resistance element comprises a plurality of elements having an identical shape.

4. The method of manufacturing the semiconductor device as claimed in claim 1,
    wherein the hydrogen diffusion preventing film is a conductive film including titanium nitride.

5. The method of manufacturing the semiconductor device as claimed in claim 1,
    wherein the hydrogen diffusion preventing film is an insulation film including silicon nitride.

6. The method of manufacturing the semiconductor device as claimed in claim 1,
    wherein a potential of the hydrogen diffusion preventing film is in a floating state.

7. The method of manufacturing the semiconductor device as claimed in claim 1, wherein:
    the semiconductor device has a multilayer wiring structure, and
    at least wiring of a bottom layer in the multilayer wiring structure constitutes the hydrogen diffusion preventing film.

8. A method of manufacturing a semiconductor device, the method including:
    a step of forming a first insulation film on a semiconductor substrate;
    a step of forming a high resistance element made of polysilicon on the first insulation film;
    a step of forming a second insulation film on the high resistance element; and
    a step of forming a hydrogen diffusion preventing film from a material having a hydrogen diffusion coefficient smaller than a hydrogen diffusion coefficient of the second insulation film on the second insulation film, wherein:
    the hydrogen diffusion preventing film is formed so as to cover a part of the high resistance element, and
    a potential of the hydrogen diffusion preventing film is in a floating state.

9. The method of manufacturing the semiconductor device as claimed in claim 8, wherein
    the hydrogen diffusion preventing film is a conductive film including titanium nitride, and the hydrogen diffusion preventing film is formed at the same time as the formation of at least wiring of a bottom layer of a semiconductor element having a multilayer wiring structure.

10. The method of manufacturing the semiconductor device as claimed in claim 8, wherein
    the high resistance elements are constituted by a plurality of elements having an identical shape.

11. The method of manufacturing the semiconductor device as claimed in claim 8, wherein
    the hydrogen diffusion preventing film is a conductive film including titanium nitride.

12. The method of manufacturing the semiconductor device as claimed in claim 8, wherein
    the hydrogen diffusion preventing film is an insulating film including silicon nitride.

13. The method of manufacturing the semiconductor device as claimed in claim 8, wherein
    the hydrogen diffusion preventing film is reed-shaped and the plurality of hydrogen diffusion preventing films are evenly arranged in parallel.

14. The method of manufacturing the semiconductor device as claimed in claim 8, wherein
    the hydrogen diffusion preventing film is provided orthogonal to the high resistance element.

15. The method of manufacturing the semiconductor device as claimed in claim 8, wherein
    the semiconductor device has a multilayer wiring structure, and at least wiring of a bottom layer in the multilayer wiring structure constitutes the hydrogen diffusion preventing film.

* * * * *